US011825698B2

(12) United States Patent
Zhang et al.

(10) Patent No.: US 11,825,698 B2
(45) Date of Patent: Nov. 21, 2023

(54) DISPLAY SUBSTRATE AND MANUFACTURING PROCESS THEREOF

(71) Applicants: Chengdu BOE Optoelectronics Technology Co., Ltd., Chengdu Sichuan (CN); BOE TECHNOLOGY GROUP CO., LTD., Beijing (CN)

(72) Inventors: Yangyang Zhang, Beijing (CN); Jing Li, Beijing (CN); Dawei Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 503 days.

(21) Appl. No.: 17/054,212

(22) PCT Filed: Apr. 27, 2020

(86) PCT No.: PCT/CN2020/087309
§ 371 (c)(1),
(2) Date: Nov. 10, 2020

(87) PCT Pub. No.: WO2020/238526
PCT Pub. Date: Dec. 13, 2020

(65) Prior Publication Data
US 2022/0293700 A1      Sep. 15, 2022

(30) Foreign Application Priority Data

May 30, 2019   (CN) .......................... 201910465408.9

(51) Int. Cl.
*H10K 59/122*   (2023.01)
*H10K 50/844*   (2023.01)
(Continued)

(52) U.S. Cl.
CPC .......... *H10K 59/122* (2023.02); *H10K 50/844* (2023.02); *H10K 71/00* (2023.02); *H10K 59/1201* (2023.02)

(58) Field of Classification Search
CPC ............. H10K 59/122; H10K 59/1201; H10K 50/844; H10K 71/00
See application file for complete search history.

(56) References Cited

U.S. PATENT DOCUMENTS

| 2011/0141717 A1* | 6/2011 | Yoshinaga | ........... H10K 50/844 |
| | | | 430/311 |
| 2015/0060806 A1* | 3/2015 | Park | ........................ H10K 71/00 |
| | | | 257/40 |

(Continued)

FOREIGN PATENT DOCUMENTS

| CN | 107799665 A | * | 3/2018 | ......... H01L 27/3244 |
| CN | 107799665 A | | 3/2018 | |

(Continued)

OTHER PUBLICATIONS

International Search Report and Written Opinion for International Application No. PCT/CN2020/087309 dated Aug. 3, 2020.

(Continued)

*Primary Examiner* — Shaun M Campbell
(74) *Attorney, Agent, or Firm* — XSENSUS LLP

(57) ABSTRACT

A display substrate is described that comprises: a display area, a retaining wall surrounding the display area, and a thin film encapsulation layer comprising a first inorganic barrier layer, an organic barrier layer, and a second inorganic barrier layer. The display area has a corner portion being a portion of the display area surrounded by the retaining wall. Convex dams are provided at a position on the substrate corresponding to the corner portion. A portion of the first inorganic barrier layer corresponding to the corner portion covers the convex dams, and a portion of the first inorganic barrier (Continued)

layer between the two adjacent convex dams forms a diversion trench. The organic barrier layer comprises cured organic material, and the organic material is provided on the portion of the first inorganic barrier layer at the corner portion under a capillary action of the diversion trench before curing.

18 Claims, 3 Drawing Sheets

(51) Int. Cl.
*H10K 71/00* (2023.01)
*H10K 59/12* (2023.01)

(56) References Cited

U.S. PATENT DOCUMENTS

| | | | |
|---|---|---|---|
| 2018/0269261 A1* | 9/2018 | Park | H10K 50/844 |
| 2019/0221776 A1* | 7/2019 | Wang | H10K 59/00 |
| 2019/0393444 A1* | 12/2019 | Nam | G06F 1/1643 |
| 2020/0185647 A1* | 6/2020 | Lee | H10K 59/122 |
| 2020/0272052 A1* | 8/2020 | Kang | G03F 7/11 |

FOREIGN PATENT DOCUMENTS

| | | | | |
|---|---|---|---|---|
| CN | 108777266 A | | 11/2018 | |
| CN | 108962953 A | * | 12/2018 | ......... H01L 27/3244 |
| CN | 109494242 A | | 3/2019 | |
| CN | 109638173 A | | 4/2019 | |
| CN | 109671866 A | | 4/2019 | |
| CN | 110379933 A | | 10/2019 | |
| CN | 108777266 B | | 4/2020 | |
| KR | 101910185 B1 | | 10/2018 | |
| WO | 2020082592 A1 | | 4/2020 | |
| WO | 2020093627 A1 | | 5/2020 | |

OTHER PUBLICATIONS

First Office Action for CN Patent Application No. 201910465408.9 dated Feb. 1, 2021.

* cited by examiner

DISPLAY SUBSTRATE AND MANUFACTURING PROCESS THEREOF

CROSS-REFERENCE TO RELATED APPLICATION

The present disclosure is the 35 U.S.C. § 371 application of International Application No. PCT/CN2020/087309, filed on Apr. 27, 2020, which is based upon and claims priority to Chinese Application No. 2019/10465408.9, filed on May 30, 2019, the entire contents of which are incorporated herein by reference.

TECHNICAL FIELD

The present disclosure relates to display device technologies, and more particularly, to a display substrate and a manufacturing process of the display substrate.

BACKGROUND

In manufacturing processes of existing display panels (such as OLED display panels), Thin Film Encapsulation (TFE) is usually used for corresponding encapsulation to prevent the intrusion of moisture or oxygen into a light-emitting layer to disable the light-emitting layer, thus resulting in defective products or affecting the reliability of products.

SUMMARY

It is a main objective of the present disclosure to overcome at least one of the above-mentioned deficiencies of the prior art, and to provide a display substrate in which ink can effectively fill a special area.

It is another main objective of the present disclosure to overcome at least one of the above-mentioned deficiencies of the prior art, and to provide a manufacturing process of a display substrate capable of effectively filling a special area with ink.

In order to achieve the above objectives, the present disclosure adopts the following technical solutions:

According to one aspect of the present disclosure, there is provided a display substrate, which comprises a display area, a retaining wall surrounding the display area, and a thin film packaging layer. The thin film encapsulation layer comprises a first inorganic barrier layer, an organic barrier layer, and a second inorganic barrier layer that are stacked. The display area of the substrate has a corner portion, wherein the corner portion is a portion of the display area surrounded by the retaining wall. A plurality of convex dams are provided at a position on the substrate corresponding to the corner portion. A portion of the first inorganic barrier layer corresponding to the corner portion covers the plurality of convex dams, and a portion of the first inorganic barrier layer between the two adjacent convex dams forms a diversion trench. The organic barrier layer comprises cured organic material ever with fluidity, and the organic material is configured to be provided on the portion of the first inorganic barrier layer at the corner portion under a capillary action of the diversion trench before curing.

According to one of the embodiments of the present disclosure, the corner portion is a portion of the display area surrounded by the retaining wall at an acute angle.

According to one of the embodiments of the present disclosure, the corner portion is a portion of the display area surrounded by the retaining wall at an obtuse angle.

According to one of embodiments of the present disclosure, extension directions of the plurality of convex dams are orientated toward a vertex of the corner portion.

According to one of the embodiments of the present disclosure, at least one of the convex dams has a length of about 200 μm in its extension direction.

According to one of the embodiments of the present disclosure, the two adjacent convex dams are provided to be spaced apart from each other, such that a portion of the substrate is exposed between the two convex dams.

According to one of the embodiments of the present disclosure, a cross-sectional shape of the convex dam perpendicular to its extension direction is a trapezoid.

According to one of the embodiments of the present disclosure, a cross-sectional shape of the convex dam perpendicular to its extension direction is an isosceles trapezoid.

According to one of the embodiments of the present disclosure, the respective convex dams have the same cross-sectional shape respectively perpendicular to their extension directions.

According to one of the embodiments of the present disclosure, the convex dam has a height less than or equal to that of the retaining wall on the substrate.

According to one embodiment of the present disclosure, the convex dam has a height of about 0.5 μm to 2 μm on the substrate.

According to one of the embodiments of the present disclosure, the convex dam has a height of about 1 μm to 2 μm on the substrate.

According to one of the embodiments of the present disclosure, material of the convex dam is an organic film layer.

According to one of the embodiments of the present disclosure, material of the retaining wall is the same as that of the convex dam.

According to one of the embodiments of the present disclosure, material of the retaining wall is different from that of the convex dam.

According to one of the embodiments of the present disclosure, the convex dam is formed of polymethyl methacrylate.

According to another aspect of the present disclosure, there is provided a manufacturing process of a display substrate, comprising steps of:

providing a substrate, wherein the substrate has a display area, and the display area has a corner portion;

providing a display structure in the display area;

providing a retaining wall surrounding periphery of the display area on the substrate, wherein the corner portion is a portion of the display area surrounded by the retaining wall;

providing a plurality of convex dams at a position on the substrate corresponding to the corner portion;

providing a first inorganic barrier layer on the substrate provided with the display structure, wherein the first inorganic barrier layer covers the display area and the display structure, and a portion of the first inorganic barrier layer between the two adjacent convex dams forms a diversion trench;

providing an organic material with fluidity on the first inorganic barrier layer, wherein the organic material is provided on a portion of the first inorganic barrier layer at the corner portion under a capillary action of the diversion trench before curing, and then is cured to form an organic barrier layer; and providing a second inorganic barrier layer on the organic barrier layer.

According to one of the embodiments of the present disclosure, providing the convex dam comprises:

providing an organic film layer at a position on the substrate corresponding to the corner portion; and coating, exposing, and developing the organic film layer in sequence to form the convex dam.

According to one of the embodiments of the present disclosure, the providing the organic material is printing, spin coating or spraying; and/or, the curing the organic material is light curing or thermal curing.

According to one of the embodiments of the present disclosure, the convex dam is formed by half-etching.

It can be seen from the above technical solutions that the advantages and positive effects of the display substrate and the manufacturing process of the display substrate proposed in the present disclosure are as follows:

In the display substrate and the manufacturing process of the display substrate proposed in the present disclosure, a plurality of convex dams are provided at a position on the substrate corresponding to the corner portion, and a portion of the first inorganic barrier layer corresponding to the corner portion covers the plurality of convex dams, such that a portion of the first inorganic barrier layer located between two adjacent convex dams forms a diversion trench. By the above-mentioned design, an organic material with fluidity can effectively fill a special area such as the corner portion under a capillary action of a diversion trench before it is cured, such that the edge of the organic barrier layer can meet design requirements and avoid the abnormality of product quality.

BRIEF DESCRIPTION OF THE DRAWINGS

Various objectives, features, and advantages of the present disclosure will become more apparent by considering the following detailed description of various embodiments of the present disclosure in conjunction with the accompanying drawings. The drawings are merely exemplary illustrations of the present disclosure and are not necessarily drawn to scale. In the drawings, the same reference signs always refer to the same or similar parts. In the drawings.

DETAILED DESCRIPTION

Typical embodiments embodying features and advantages of the present disclosure will be described in detail in the following description. It should be understood that various changes can be made to different embodiments of the present disclosure without departing from the scope of the present disclosure, and the description and drawings therein are essentially for illustrative purposes, rather than limiting the present disclosure.

The following description of different exemplary embodiments of the present disclosure is made in conjunction with the accompanying drawings, which form part of the present disclosure, and in which different exemplary structures, systems and steps that can realize various aspects of the present disclosure are shown by way of example. It should be understood that other specific solutions of components, structures, exemplary devices, systems, and steps may be adopted and structural and functional modifications may be made without departing from the scope of the present disclosure. Moreover, although terms such as "above", "between", "within", and so on, may be used herein to describe different exemplary features and elements of the present disclosure, and such terms are used herein only for the sake of convenience, such as the directions illustrated in the accompanying drawings. Nothing in this specification should be understood as requiring a specific three-dimensional direction of the structure to fall within the scope of the present disclosure.

The thin film encapsulation is to generate a barrier layer that blocks moisture and oxygen on a light-emitting layer of an OLED. The barrier layer adopts the design of "inorganic film-organic film-inorganic film". The inorganic film can prevent the intrusion of moisture and oxygen while the organic film can absorb stress and improve bending performance of the panel.

In the related thin film encapsulation, the organic film is formed by inkjet print. In the inkjet print, organic material (e.g., ink) has certain fluidity before curing, and the ability to control its edge is an important factor that affects the quality and reliability of products. A retaining wall is provided on the edge of the organic film, such that the edge of the organic film stays within the retaining wall, so as to control the edge of the organic film.

Figure 1:
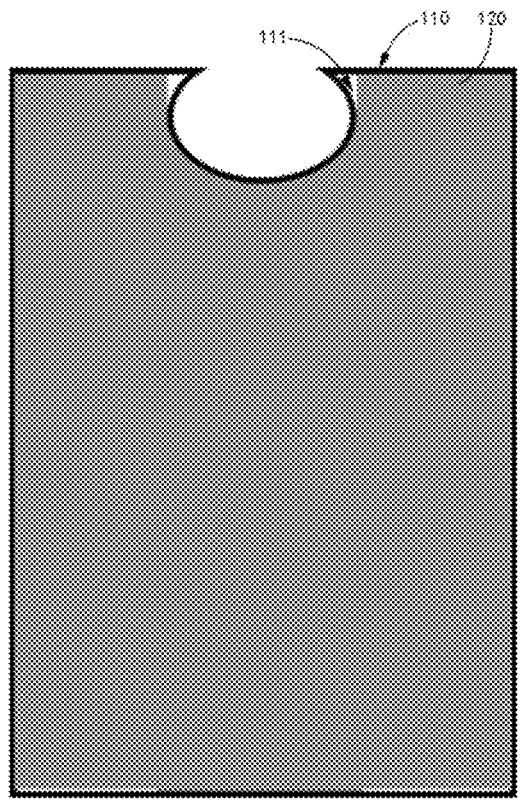
FIG. 1 is a schematic diagram illustrating a conventional display substrate.

However, due to the diversification of display product designs, product edges are not limited to regular shapes. For a display product with a special shape, the retaining wall will be designed as a special shape accordingly. Furthermore, due to the limitation of the own viscosity and fluidity of the ink, the ink cannot effectively fill some special-shaped areas, such as corner portions, especially areas in acute-angle shapes. For example, FIG. 1 is a schematic diagram of a related display substrate. As shown in FIG. 1, an organic film 120 on a display substrate 110 cannot fill a corner portion 111, so that the edge of the organic film cannot meet design requirements, resulting in abnormal product quality.

Embodiments of Display Substrate

Figure 2:
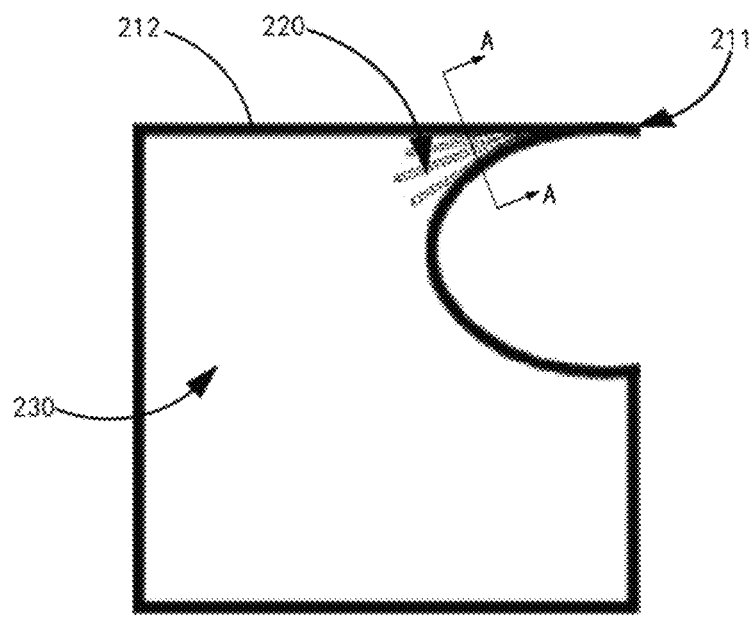
FIG. 2 is a schematic diagram illustrating a display substrate according to an exemplary embodiment.

FIG. 2 is a schematic diagram representatively illustrating a display substrate provided by the present disclosure. In this exemplary embodiment, description will be made by taking an example in which the display substrate provided by the present disclosure is applied to an OLED package structure. It is apparent for those skilled in the art to understand that various modifications, additions, substitutions, deletions or other changes may be made on the following specific embodiments in order to apply the relevant design of the present disclosure to other types of display devices or other technologies, which fall into the scope of the principle of the display substrate provided by the present disclosure.

Figure 3:
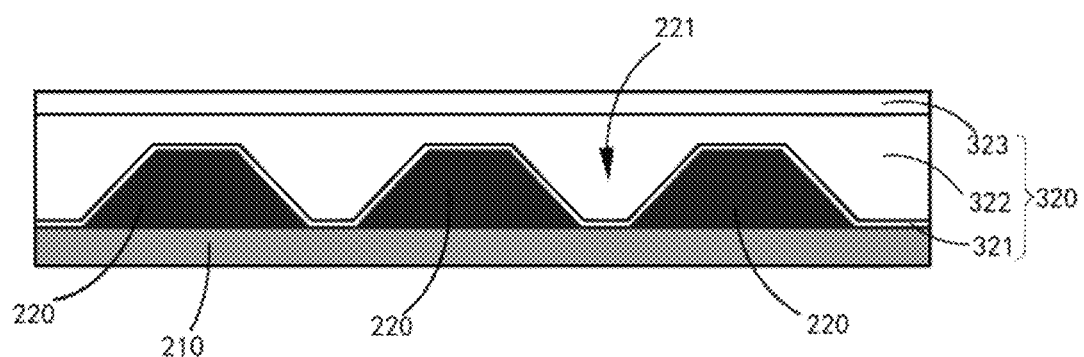
FIG. 3 is a cross-sectional view taken along line A-A in FIG. 2.

As shown in FIG. 3, and in conjunction with FIG. 2, FIG. 3 is a typical cross-sectional view taken along line A-A in FIG. 2. In this embodiment, the display substrate proposed in the present disclosure is, for example, an OLED substrate 210, which mainly includes a substrate 210. A display area is provided on a surface on one side of the substrate 210, and the display area is provided with a display structure, and has a corner portion 211. A retaining wall 212 and a thin film encapsulation layer 320 are provided on the surface on the side of the substrate 210. The retaining wall 212 is provided to surround periphery of the display area. The thin film encapsulation layer 320 covers both the display area and the display structure. The corner portion 211 is a portion of the display area surrounded by the retaining wall 212. As an embodiment, the corner portion 211 is a portion of the display area surrounded by the retaining wall 212 at an acute angle. As another embodiment, the corner portion 211 is a portion of the display area surrounded by the retaining wall 212 at an obtuse angle. The thin film encapsulation layer 320 includes a first inorganic barrier layer 321, an organic barrier layer 322 and a second inorganic barrier layer 323 that are sequentially stacked on the surface on the side of the substrate 210. It should be noted that FIG. 2 shows the substrate 210 on which the thin film encapsulation layer 320 is provided and the retaining wall 212, but the structure and display structure of the substrate 210 are not shown.

As shown in FIGS. 2 and 3, in this embodiment, a plurality of convex dams 220 are provided on the surface on the side of the substrate 210 corresponding to the corner portion 211. The portion of the first inorganic barrier layer 321 corresponding to the corner portion 211 covers the substrate 210 provided with the plurality of convex dams 220. When the organic barrier layer 322 is provided on the first inorganic barrier layer 321, the portion of the first inorganic barrier layer 321 located between the two adjacent convex dams 220 forms a diversion trench 221 that facilitates filling of organic materials. The organic barrier layer 322 is formed of organic materials with fluidity (e.g., ink) (for example, it is formed by a curing process after spin-coating the ink). Therefore, when the organic material is disposed on the first inorganic barrier layer 321, the organic material fills the portion of the first inorganic barrier layer 321 located on the corner portion 211 by use of the capillary action of the diversion trench 221 before curing, such that the edge of the organic barrier layer 322 meets design requirements and avoids abnormal product quality.

As shown in FIG. 2, in this embodiment, extension directions of the plurality of convex dams 220 may be orientated toward the vertex of the corner portion 211. Namely, centering about the vertex of the corner portion 211, the extension directions of the plurality of convex dams 220 may be set in the form of radial distribution. As an embodiment, the length of the convex dam 220 in its extension direction is about 200 μm, where "about" here refers to a value within the range of allowable errors of fabrication and strategy without strictly limiting the boundary.

As shown in FIG. 2, in this embodiment, the two adjacent convex dams 220 may be provided to be spaced apart from each other, such that a portion of the substrate 210 is exposed between the two adjacent convex dams 220. In other embodiments, the two adjacent convex dams 220 may be provided to adjoin each other as well. In addition, when there are three or more convex dams 220, the relative arrangement form of any two adjacent convex dams 220 may be the same or different.

As shown in FIG. 3, in this embodiment, the cross-sectional shape of the convex dam 220 perpendicular to its extension direction may be a trapezoid. Further, the above-mentioned cross-section of the convex dam 220 may be an isosceles trapezoid.

As shown in FIG. 3, in this embodiment, the cross-sectional shapes of the respective convex dams 220 perpendicular to their extension directions may be the same. The above-mentioned cross-sections of the respective convex dams 220 may be in the same shape and size, or in the same shape but different sizes.

In this embodiment, the height of the convex dam 220 on the substrate 210 is less than or equal to that of the retaining wall 212. Here, as shown in FIG. 3, the height of the convex dam 220 on the substrate 210 refers to a distance from the vertex of the convex dam 220 under the organic barrier layer 322 to the bottom of the convex dam 220 on the substrate 210. Accordingly, it can be ensured that the organic material on the convex dam 220 will not overbrim the retaining wall 212, and the boundary control on the organic material by the retaining wall 212 will not be affected. Specifically, an example is taken in which the height of the retaining wall 212 on the substrate 210 is about 1 μm to 2 μm and the height of the convex dam 220 on the substrate 210 may be about 0.5 μm to 2 μm, where "about" here refers to a value within the range of allowable errors of fabrication and strategy without strictly limiting the boundary.

In this embodiment, the material of the convex dam 220 may be an organic film layer or may be formed of polymethyl methacrylate (PMMA). For example, the preparation process of the convex dam 220 may be as follows: the convex dam 220 is prepared on the substrate 210 by using an organic film layer. Specifically, after the manufacturing procedure of a circuit of the substrate 210 is completed, the above-mentioned convex dam 220 may be manufactured by use of specific process order of coating→exposure→development. As an embodiment, the material of the retaining wall 212 is the same as that of the convex dam 220. As another embodiment, the material of the retaining wall 212 is different from that of the convex dam 220.

As an embodiment, the convex dam 220 may be formed by etching the material for forming the convex dam 220 by a half-etching method as well.

It should be noted here that the display substrates shown in the drawings and described in the specification are only a few examples of many kinds of display substrates that can adopt the principle of the present disclosure. It should be clearly understood that the principle of the present disclosure is by no means limited to any details or any components of the display substrates shown in the drawings or described in the specification.

Embodiments of Manufacturing Process of Display Substrate

FIGS. 4 to 7 are schematic diagrams typically illustrating main processing of the manufacturing process of the display substrates proposed by the present disclosure. In this exemplary embodiment, description is made by taking an example in which the display substrates proposed by the present disclosure are applied to the manufacturing process of the OLED package structure. It is apparent for those skilled in the art to understand that various modifications, additions, substitutions, deletions or other changes can be made to the following specific embodiments in order to apply the relevant design of the present disclosure to the manufacturing processes of other types of display devices, which fall into the scope of the principle of the manufacturing processes of the display substrates proposed by the present disclosure.

As shown in FIGS. 2 to 7, the manufacturing process of the display substrate proposed in the present disclosure includes the following:

A substrate 210 is provided, wherein a display area is provided on a surface on one side of the substrate 210, and the display area has a corner portion 211.

A display structure is provided in the display area (not shown).

A retaining wall 212 surrounding periphery of the display area is provided on the surface on the side of the substrate 210, wherein the corner portion 211 is a portion of the display area surrounded by the retaining wall 212. As an embodiment, the corner portion 211 is a portion of the display area surrounded by the retaining wall 212 at an acute angle. As another embodiment, the corner portion 211 is a portion of the display area surrounded by the retaining wall 212 at an obtuse angle.

Figure 4:
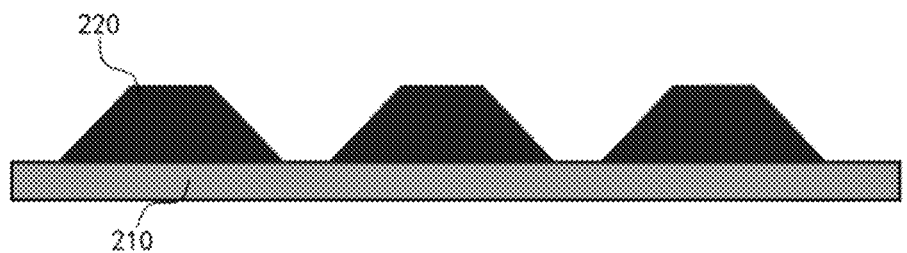
FIG. 4 is a schematic diagram illustrating a display substrate in a manufacturing process of the display substrate according to an exemplary embodiment.
Figure 5:
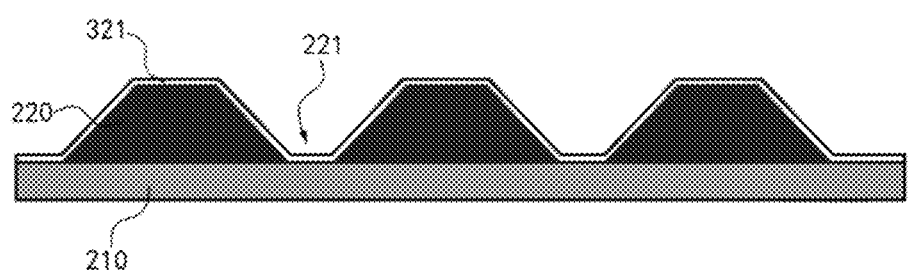
FIG. 5 is a schematic diagram illustrating a display substrate in a manufacturing process of the display substrate according to an exemplary embodiment.
Figure 6:
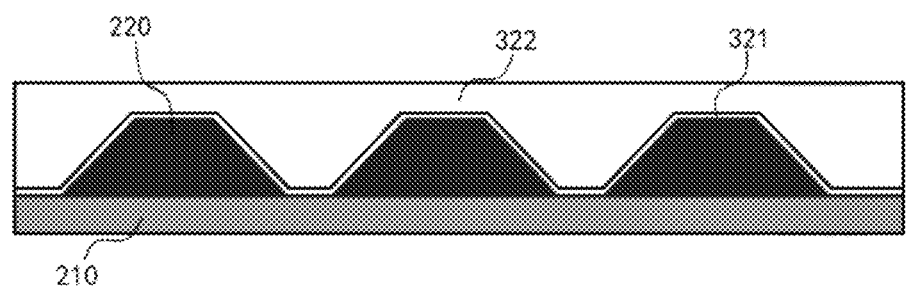
FIG. 6 is a schematic diagram illustrating a display substrate in a manufacturing process of the display substrate according to an exemplary embodiment.

A plurality of convex dams 220 are provided on the surface on the side of the substrate 210 corresponding to the corner portion 211 (see FIG. 4).

A first inorganic barrier layer 321 is provided on the substrate 210 provided with the display structure. The first inorganic barrier layer 321 covers the display area, the display structure, and the convex dam 220. The portion of the first inorganic barrier layer 321 located between two adjacent convex dams 220 forms a diversion trench 221 (see FIG. 5).

Organic material with fluidity is provided on the first inorganic barrier layer 321. The organic material is provided on a portion of the first inorganic barrier layer 321 located on the corner portion 211 under a capillary action of the diversion trench 221 before it is cured, and then the organic material is cured to form an organic barrier layer 322 (see FIG. 6).

Figure 7:
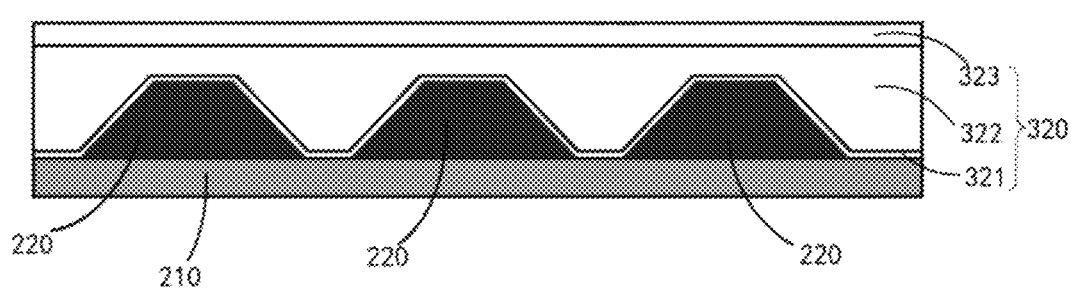
FIG. 7 is a schematic diagram illustrating a display substrate in a manufacturing process of the display substrate according to an exemplary embodiment.

A second inorganic barrier layer 323 is provided on the organic barrier layer 322 (see FIG. 7).

Further, in this embodiment, the convex dam 220 may be provided by using the following steps and processes: an organic film layer is provided at a position on the surface on the side of the substrate 210 corresponding to the corner portion 211, then, the organic film layer is coated, exposed and developed in sequence to form the convex dam 220 directly.

As an embodiment, the convex dam 220 may be formed by etching the material for forming the convex dam 220 by a half-etching method as well.

Further, in this embodiment, the processes of the organic material may be printing, spin coating or spraying.

Further, in this embodiment, the curing process of the organic material may be light curing or thermal curing.

It should be noted here that the manufacturing processes of the display substrates shown in the drawings and described in the specification are only a few examples of many kinds of manufacturing processes that can adopt the principle of the present disclosure. It should be clearly understood that the principle of the present disclosure is by no means limited to any details or any steps of the manufacturing processes of the display substrates shown in the drawings or described in the specification.

In summary, in the display substrate and the manufacturing process of the display substrate proposed in the present disclosure, a plurality of convex dams are provided at a position on the substrate corresponding to the corner portion, and a portion of the first inorganic barrier layer corresponding to the corner portion covers the plurality of convex dams, such that a portion of the first inorganic barrier layer located between two adjacent convex dams forms a diversion trench. By the above-mentioned design, organic material with fluidity can effectively fill a special area such as the corner portion under the capillary action of a diversion trench before it is cured, such that the edge of the organic barrier layer can meet the design requirements and avoid the abnormality of product quality.

Exemplary embodiments of the display substrates and the manufacturing processes of the display substrates proposed in the present disclosure have been shown in the drawings and described above in detail. However, the embodiments of the present disclosure are not limited to the specific embodiments described herein, on the contrary, component parts and/or steps in each embodiment may be used individually and separately from other component parts and/or steps described herein. Each component part and/or step in one embodiment may be used in combination with other component parts and/or steps of other embodiments as well. When elements/component parts/and others described and/or illustrated herein are introduced, words such as "one", "a/an" and "above", and so on, are used herein to indicate the presence of one or more elements/component parts/and others. Terms "including", "comprising", and "having" have an inclusive meaning which means that there may be additional elements/component parts/and others in addition to the listed elements/component parts/and others.

Although the display substrates and the manufacturing processes of the display substrates proposed in the present disclosure have been described according to different specific embodiments, those skilled in the art will recognize that the implementation of the present disclosure can be modified within the spirit and scope of the claims.

What is claimed is:

1. A display substrate having a display area, comprising:
a retaining wall surrounding the display area;
a thin film encapsulation layer comprising a first inorganic barrier layer, an organic barrier layer, and a second inorganic barrier layer that are stacked; and
a plurality of convex dams, wherein:
the display area of the substrate has a corner portion, wherein the corner portion is a portion of the display area surrounded by the retaining wall;
the plurality of convex dams are provided at a position on the substrate corresponding to the corner portion;
extension directions of the plurality of convex dams are orientated toward a vertex of the corner portion;
a portion of the first inorganic barrier layer corresponding to the corner portion covers the plurality of convex dams, and a portion of the first inorganic barrier layer between two adjacent ones of the plurality of convex dams forms a diversion trench; and
the organic barrier layer comprises cured organic material, wherein the organic material has fluidity before curing, and the organic material is on the portion of the first inorganic barrier layer at the corner portion under a capillary action of the diversion trench before curing.

2. The display substrate according to claim 1, wherein the corner portion is a portion of the display area surrounded by the retaining wall at an acute angle.

3. The display substrate according to claim 1, wherein at least one of the plurality of convex dams has a length of about 200 μm in the extension direction of the at least one of the plurality of convex dams.

4. The display substrate according to claim 1, wherein the two adjacent ones of the plurality of convex dams are spaced apart from each other, such that a portion of the substrate is exposed between the two adjacent ones of the plurality of convex dams.

5. The display substrate according to claim 1, wherein a cross-sectional shape of at least one of the plurality of convex dams perpendicular to an extension direction of the at least one of the plurality of convex dams is a trapezoid.

6. The display substrate according to claim 1, wherein a cross-sectional shape of at least one of the plurality of convex dams perpendicular to an extension direction of the at least one of the plurality of convex dams is an isosceles trapezoid.

7. The display substrate according to claim 1, wherein cross-sectional shapes of respective ones of the plurality of convex dams perpendicular to extension directions of the respective ones of the plurality of convex dams are the same.

8. The display substrate according to claim 1, wherein at least one of the plurality of convex dams has a height less than or equal to that of the retaining wall on the substrate.

9. The display substrate according to claim 1, wherein at least one of the plurality of convex dams has a height of about 0.5 μm to 2 μm on the substrate.

10. The display substrate according to claim 1, wherein the retaining wall has a height of about 1 μm to 2 μm on the substrate.

11. The display substrate according to claim 1, wherein a material of the plurality of convex dams is an organic film layer.

12. The display substrate according to claim 1, wherein a material of the retaining wall is the same as that of the plurality of convex dams.

13. The display substrate according to claim 1, wherein a material of the retaining wall is different from that of the plurality of convex dams.

14. The display substrate according to claim 1, wherein at least one of the plurality of convex dams is formed of polymethyl methacrylate.

15. A manufacturing process of a display substrate, comprising:
providing a substrate, wherein the substrate has a display area and the display area has a corner portion;
providing a display structure in the display area;
providing a retaining wall surrounding a periphery of the display area on the substrate, wherein the corner portion is a portion of the display area surrounded by the retaining wall;
providing a plurality of convex dams at a position on the substrate corresponding to the corner portion; wherein extension directions of the plurality of convex dams are orientated toward a vertex of the corner portion;
providing a first inorganic barrier layer on the substrate provided with the display structure, wherein the first inorganic barrier layer covers the display area and the display structure, and a portion of the first inorganic barrier layer between two adjacent ones of the plurality of convex dams forms a diversion trench;
providing organic material with fluidity on the first inorganic barrier layer, wherein the organic material is provided on a portion of the first inorganic barrier layer at the corner portion under a capillary action of the diversion trench before curing, and then is cured to form an organic barrier layer; and
providing a second inorganic barrier layer on the organic barrier layer.

16. The manufacturing process of the display substrate according to claim 15, wherein providing the plurality of convex dams comprises:
providing an organic film layer at a position on the substrate corresponding to the corner portion; and
coating, exposing, and developing the organic film layer in sequence to form the plurality of convex dams.

17. The manufacturing process of the display substrate according to claim 15, wherein providing the organic material comprises at least one of: printing, spin coating, spraying; and curing the organic material, wherein the curing of the organic material is light curing or thermal curing.

18. The manufacturing process of the display substrate according to claim 15, wherein the plurality of convex dams are formed by half-etching.

* * * * *